United States Patent [19]
Miyagi

[11] Patent Number: 4,631,424
[45] Date of Patent: Dec. 23, 1986

[54] MULTI-INPUT LOGIC CIRCUIT
[75] Inventor: Isamu Miyagi, Tokyo, Japan
[73] Assignee: Nippon Electric Co., Ltd., Tokyo, Japan
[21] Appl. No.: 480,610
[22] Filed: Mar. 30, 1983
[30] Foreign Application Priority Data
  Mar. 30, 1982 [JP] Japan .................. 57-52031
[51] Int. Cl.[4] ......................... H03K 19/094
[52] U.S. Cl. ................... 307/448; 307/443; 307/264
[58] Field of Search ........... 307/445, 448, 450, 443, 307/475, 264
[56] References Cited
  U.S. PATENT DOCUMENTS
  4,296,339 10/1981 Murotani ............ 307/450
  4,489,246 12/1984 Nishiuchi ............ 307/448

Primary Examiner—Stanley D. Miller
Assistant Examiner—D. R. Hudspeth
Attorney, Agent, or Firm—Sughrue, Mion, Zinn, Macpeak and Seas

[57] ABSTRACT

A multi-input logic circuit which operates in a push-pull manner is composed of first and second logic sections. The first logic section is coupled between an output terminal and a reference voltage source and composed of a plurality of enhancement field effect transistors receiving a plurality of first input signals. The second logic section is coupled between the output terminal and a power source and composed of a plurality of depletion field effect transistors receiving a plurality of second input signals complementary to the first logic signals.

5 Claims, 16 Drawing Figures

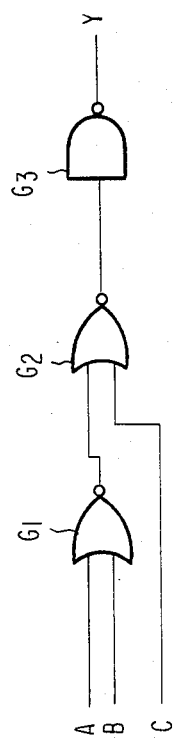
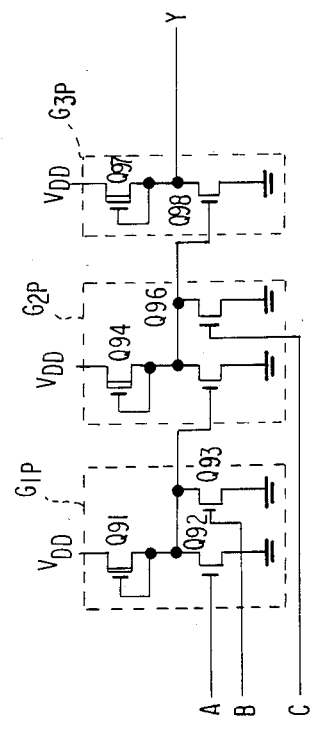
FIG. 8
FIG. 9 PRIOR ART
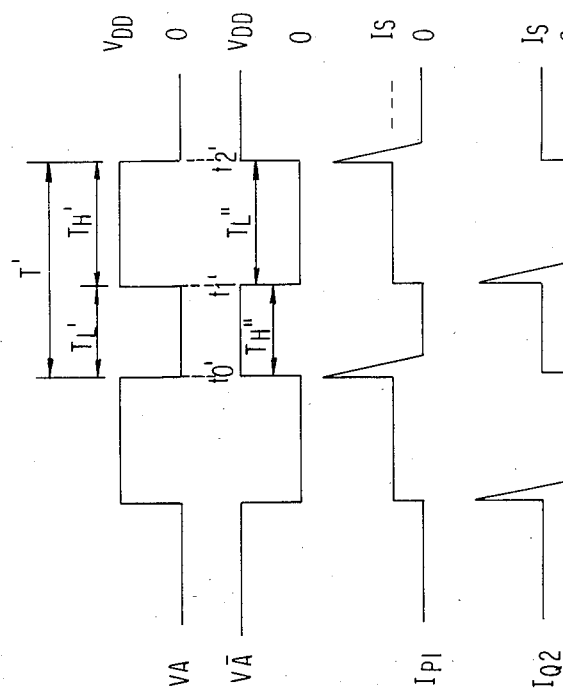
FIG. 5

MULTI-INPUT LOGIC CIRCUIT

BACKGROUND OF THE INVENTION

The present invention relates to a logic circuit and more particularly to an E/D logic circuit constituted by a depletion mode field-effect transistor (referred to as "D-mode FET" hereinafter) and an enhancement mode field-effect transistor (referred to as "E-mode FET" hereinafter).

Recently, an E/D logic circuit, e.g., an E/D inverter employing a D-mode FET as a load transistor and an E-mode FET as an input transistor has widely been used as a logic circuit integrated in a semiconductor integrated circuit, since such an E/D logic circuit has the following advantages. First, a D-mode FET, acting as a load transistor and having at one input a power supply voltage, can produce the power supply voltage at an output terminal without signal level reduction. Second, the D-mode FET operates as a constant current source and, hence, a load capacitance to be driven can be charged at a high speed. In such an E/D logic circuit, however, at least one input transistor is made conductive, and via this conducting transistor, a current flows through a D-mode FET as a load. The power consumption by this current naturally generates heat, resulting in a rise in temperature of the semiconductor chip, which makes the circuit operation conditions unstable and hinders logic circuits from being arranged with a high density.

Accordingly, if it is contrived to decrease the current flowing through the load transistor for reducing the power consumption, then the operating speed of the circuit lowers since it becomes impossible to charge at high speed the capacitance loaded onto the output terminal. In consequence, the conventional E/D logic circuit has a large power consumption as well as a limited operating speed. Therefore, it has been difficult to realize a large-scale integration thereof on a semiconductor chip.

The conventional semiconductor integrated circuit has a power consumption of not greater than about 1 watt in the case where the integration scale is smaller than 2000 gates and can be put into practical use by considering the heat dissipation of the chip. However, when integration scale of the integrated circuit is 10000 gates or more, the power consumption thereof becomes more than 5 watts, so that the circuit is no more practical.

Moreover, the operating speed of the conventional E/D logic circuit is unsatisfactory under the above-mentioned limitation of suppressing the power consumption. Particularly, the total operating speed has been obliged to be unsatisfactory in the circuit formed by cascading logic circuits over a multiplicity of stages.

SUMMARY OF THE INVENTION

It is, therefore, an object of the invention to provide an E/D logic circuit which operates with a small power consumption and at a high speed.

It is another object of the invention to provide an E/D logic circuit suitable for a large-scale integrated circuit.

The logic circuit according to the invention has at least two cascaded logic stages. The first logic stage has first and second logic sections. The first logic section includes an FET for receiving a first input signal and an FET for receiving a second input signal opposite in phase to the first input signal and generates a first output signal, while the second logic section includes an FET for receiving the second input signal and an FET for receiving the first input signal and generates a second output signal opposite in phase to the first output signal. On the other hand, the second logic stage has a third logic section having an FET receiving the first output signal and an FET receiving the second output signal thereby to generate a third output signal, and a fourth logic section having an FET receiving the second output signal and an FET receiving the first output signal thereby to generate a fourth output signal complementary to the third output signal. In the invention, all the first through fourth logic sections are adapted to be driven in a push-pull manner in response to at least a pair of complementary signals and hence hardly consume power. Moreover, since each logic section has no DC path, the capacitance loaded onto the output of each logic section is connected to only one of either a power source or ground depending on the input state of the logic section, and charged and discharged rapidly. Therefore, each logic section can operate at a high speed.

In other words, the logic circuit according to the invention has logic stages each constituted by a pair of circuits adapted to generate respective output signals complementary to each other in accordance with at least a pair of input signals. Such a logic stage has a pair of circuits adapted to operate in a push-pull manner on receipt of at least a pair of input signals and generate output signals complementary to each other. Accordingly, the subsequent logic stage which operates on receipt of the outputs of the first-mentioned logic stage is able to operate in a push-pull manner by means of the pair of outputs.

The logic circuit according to the invention having the above construction will be referred to as "Complementary Push-pull Pair MOS" ($CP^3$ MOS) hereinafter in connection with the fact that each logic stage is constituted by a pair of push-pull circuits complementary to each other.

The $CP^3$MOS logic circuit has the following features.
(1) Propagation delay is smaller than that for a conventional E/D MOS circuit.
(2) Delay-power product is about one-tenth as large as that for a conventional E/D MOS circuit.
(3) Wide operating voltage range.
(4) Noise immunity is twice as large as that for a conventional E/D MOS circuit at least.
(5) Inverter-less logic design is feasible.
(6) Two-phase-clock circuit is easily designed.

BRIEF DESCRIPTION OF THE DRAWINGS

FIG. 5 is a timing chart for explaining the propagation delay and delay-power product of the inverter circuit pair shown in FIG. 4;

FIG. 8 is a block diagram of a multi-input logic circuit;

FIG. 9 is a circuit diagram of the logic circuit of FIG. 8 according to the prior art;

DESCRIPTION OF THE PREFERRED EMBODIMENTS

Throughout the following description, each of transistors is assumed to be an N-channel MOS transistor.

Figure 1:
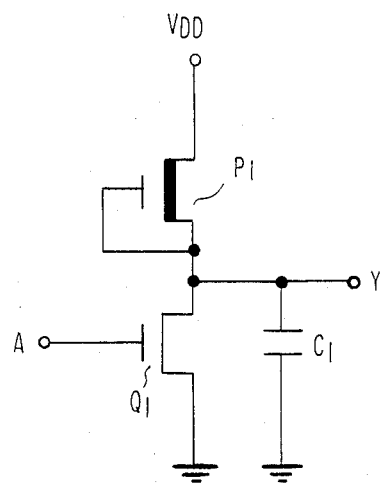
FIG. 1 is a circuit diagram of an E/D inverter as one stage according to the conventional circuit system.

Referring now to FIG. 1 showing an inverter circuit as one stage according to the conventional circuit system called the E/D arrangement employing E- and D-mode FETs as constituent elements. In this arrangement, the drain electrode of a D-mode FET $P_1$ is connected to a power source $V_{DD}$, and both the gate and source electrodes thereof are connected to the drain electrode of an E-mode FET $Q_1$. The source electrode of the FET $Q_1$ is grounded, and input terminal A and an output terminal Y are led out from the gate and drain electrodes of the FET $Q_1$.

As will be understood from the example shown in FIG. 1, the conventional circuit generally employs the D-mode FET as a constant-current source type load element. Consequently, when the E mode FET $Q_1$ is in the conducting state, a constant current flows from the power source $V_{DD}$ via the D-mode FET $P_1$ to the ground, and power is consumed. The conventional circuit is unable to decrease effectively the power consumed at that time due to the following reason. Namely, in the case where the potential at the input terminal A varies and the E-mode FET $Q_1$ is brought into the nonconducting state, the time required to charge a parasitic capacitance $C_1$ present between the output terminal Y and the ground so that the state of potential at the output terminal Y is inverted is substantially inversely proportional to the above-mentioned constant current flowing through the D-mode FET $P_1$. Consequently, if the above-mentioned power consumed when the E-mode FET $Q_1$ is in the conducting state is contrived to be smaller, the operating speed of the inverter is inevitably lowered.

Since the above-mentioned fact is not only for the inverter circuit and the same is the case with logic circuits, such as NAND, NOR, OR, etc., according to the conventional circuit configuration, it has been extremely difficult to realize a large-scale integrated circuit capable of operating with small power consumption and at a high speed by employing a large number of these logic circuits.

In order to simplify the description, it is assumed that the gain coefficients $\beta_D[A/V^2]$ and threshold voltages $V_{TD}(<0[v])$ of respective D-mode FETs appearing in the drawings are the same and also the gain coefficients $\beta_E[A/V^2]$ and the threshold voltages $V_{TE}(>0[v])$ of respective E-mode FETs appearing in the drawings are the same and moreover, the FETs are previously set so as to satisfy the following condition: $\beta_D/\beta_E \approx 0$. In addition, it is assumed that parasitic capacitances shown in the drawings also have the same electrostatic capacity $C_{[F]}$ and the potential $V_{DD[V]}$ as the power source is previously set so as to be $V_{DD} >> V_{TE}$. These settings coincide with those required for designing of the conventional circuit, respectively.

Figure 2:
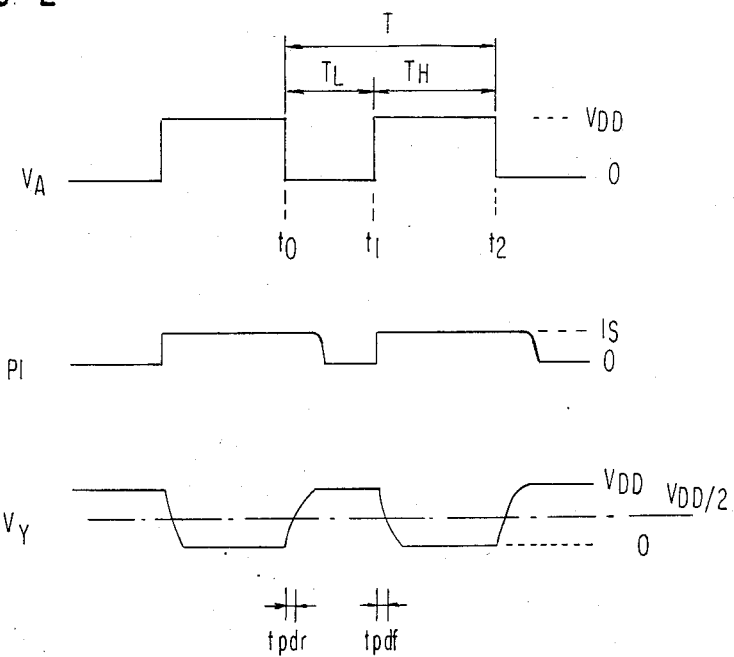
FIG. 2 is a timing chart for explaining the propagation delay and delay-power product of the inverter shown in FIG. 1.

The propagation delay $t_{pd}$ of the inverter as one stage according to the conventional circuit configuration shown in FIG. 1 is first calculated. FIG. 2 shows a current $I_{p1}$ flowing through the D-mode FET $P_1$ and a potential $V_Y$ appearing at the output terminal Y, with the horizontal axis taken as a time axis, in the case of applying to the input terminal A such a step signal $V_A$ that, with a potential amplitude $V_{DD}$, the state of low potential $0_{[V]}$ and the state of high potential $V_{DD}$ continue for the time $T_L$, $T_H$ (second) respectively and repeat at a period $T = T_L + T_H$. Immediately before the time $t_0$, the E-mode FET $Q_1$ is in the conducting state, therefore, the output potential $V_Y$ is $0_V$ on the assumption that $\beta_D/\beta_E \approx 0$. Immediately after the time $t_0$, the gate potential of the E-mode FET $Q_1$ is $0_{[V]}$, therefore, the E-mode FET $Q_1$ is in the nonconducting state on the assumption that $V_{TE} < 0_{[V]}$, and the parasitic capacitance $C_1$ present between the output terminal Y and the ground is charged through the D-mode FET $P_1$ functioning as a constant-current source. After the time has sufficiently passed, the output potential $V_Y$ rises to be equal to the high potential $V_{DD}$ and thereafter the output potential is maintained constant at the high potential $V_{DD}$. In this case, the time required for the output potential $V_Y$ to become $V_{DD}/2$ after the time $t_0$ is expressed by $t_{pdr}$.

Next, immediately after the time $t_1$, the gate potential of the E-mode FET $Q_1$ becomes the high potential $V_{DD}$, therefore, the E-mode FET $Q_1$ is made conductive, causing the electric charge stored in the capacitor $C_1$ until the time $t_1$ to be started to be discharged. Consequently, the output potential $V_Y$ lowers from the value $V_{DD}$, and after the time has sufficiently passed, the output potential $V_Y$ becomes $0_{[V]}$ on the assumption that $\beta_D/\beta_E \approx 0$ and thereafter the output potential is maintained constant at $0_{[V]}$. In this case, if the time required for the output potential $V_Y$ to become $V_{DD}/2$ after the time $t_1$ is expressed by $t_{pdf}$, then the propagation delay $t_{pd}$ is represented by $t_{pd} = (t_{pdr} + t_{pdf})/2$.

Since $t_{pdr} = CV_{DD}/\beta_D V_{TD}^2$ and $t_{pdf} = CV_{DD}/\beta_E(V_{DD} - V_{TE})^2$, the propagation delay $t_{pd}$ is calculated from the following formula:

$$t_{pd} = \frac{CV_{DD}}{2}\left(\frac{1}{\beta_D V_{TD}^2} + \frac{1}{\beta_E(V_{DD} - V_{TE})^2}\right)$$

Next, an average power consumption $W_1$ of the conventional inverter circuit is calculated during one period from the time $t_0$ to the time $t_2$. The average power consumption $W_1$ can be calculated from the fact that between the energy P consumed during one period T and the average power consumption $W_1$, a relationship of $W_1 = P/T$ is established and the fact that the current flowing out from the power source $V_{DD}$ coincides with the current $I_{p1}$ flowing out from the D-mode FET $P_1$. The energy $P_L$ consumed from the time $t_0$ to the time $t_1$, i.e., during the period $T_L = t_1 - t_0$, is represented as follows: $P_L = CV_{DD}^2$ J, and the energy $P_H$ consumed from the time $t_1$ to the time $t_2$, i.e., during the period $T_H = t_2 - t_1$, is represented as follows: $P_H = (V_{DD}\beta_D V_{TD}^2 T_H)/2J$. Here, $T_H$ denotes the period that $V_A$ takes a high level within one cycle period T as shown in FIG. 2. Therefore, the average power consumption $W_1$ is calculated from the following formula:

$$W_1 = \frac{P_L + P_H}{T} = \frac{1}{T}\left(CV_{DD}^2 + \frac{V_{DD}\beta_D V_{TD}^2}{2} T_H\right)$$

Now, let us assume a series-connected inverter circuit I(n) with n stages formed by cascading n number of inverter circuits $I_1, I_2, \ldots, I_n$ such as shown in FIG. 1, i.e., connecting the output terminal Y of the inverter circuit $I_1$ to the input terminal A of the inverter circuit $I_2$, the output terminal Y thereof to the input terminal A of the inverter circuit $I_3, \ldots$, and the output terminal Y of the inverter circuit $I_{n-1}$ to the input terminal A of the inverter circuit $I_n$. In the case where the input signal $V_A$ shown in FIG. 2 is applied to the input terminal of the inverter $I_1$ as the first stage, an average power consumption $W_n$ of the circuit $I_{(n)}$ during the period T changes as follows according to the number of stages n formed by the respective inverter circuits under $$W_0 = \frac{1}{T}\left(CV_{DD}^2 + \frac{V_{DD}\beta_D V_{TD}^2}{2} T_L\right) \quad W_1 = W_1,$$

$W_2 = W_0 + W_1$, $W_3 = W_0 + 2W_1$, $W_4 = 2W_0 + 2W_1$, $W_5 = 2W_0 + 3W_1, \ldots, W_n = mW_D + mW_1$ (in the case of $n = 2m$), $W_n = mW_0 + (m+1)W_1$ (in the case of $n = 2m + 1$).

From the above, the average power consumption W per stage formed by each of the inverter circuits constituting the circuit $I_{(n)}$ is $W = (W_0 + W_1)/2$ in the case where the number of the inverter stages n satisfies the condition $1 << n$. It is proper to employ W rather than the $W_1$ in examining an average power consumption in one inverter circuit stage as a constituent circuit of an integrated circuit. Accordingly, the delay-power product E in one stage of the conventional inverter circuit is calculated from the following formula:

$$E = W t_{pd} = \frac{CV_{DD}}{2}\left(\frac{CV_{DD}^2}{T} + \frac{V_{DD}\beta_D V_{TD}^2}{4}\right).$$

$$\left(\frac{1}{\beta_D V_{TD}^2} + \frac{1}{\beta_E(V_{DD} - V_{TE})^2}\right)$$

Figure 3:
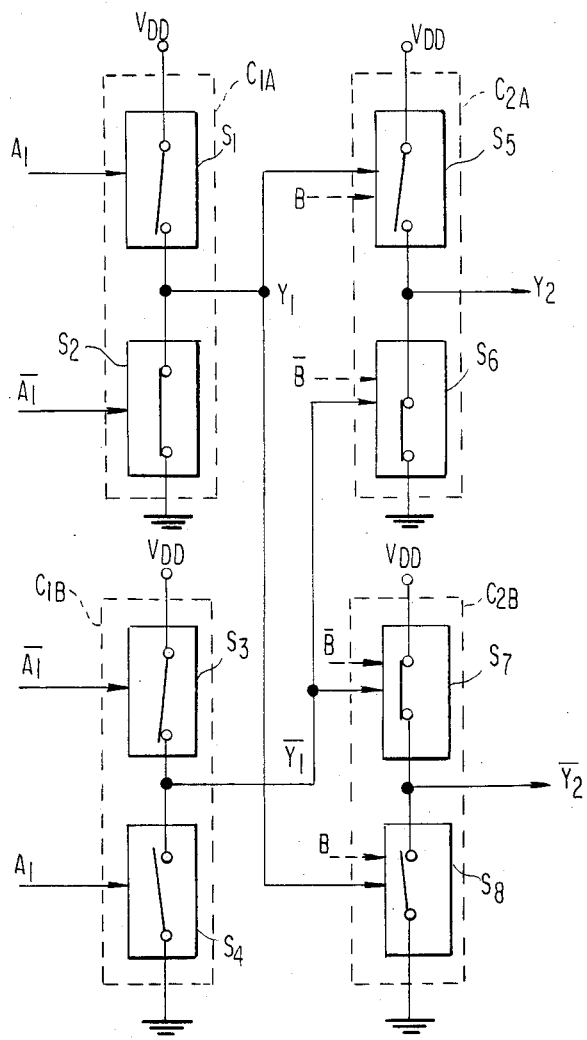
FIG. 3 is a block diagram showing the basic construction of the invention.

The fundamental construction of the invention will be described hereinunder with reference to FIG. 3.

First-stage logic sections $C_{1A}$ and $C_{1B}$ generate outputs $\overline{Y_1}$ and $Y_1$ on receipt of pairs of input signal systems $(A_1, \overline{A_1})$ and $(A_1, \overline{A_1})$, respectively. In this case, each of the signal systems $(A_1, \overline{A_1})$ may be either a single bit signal $(a_1, \overline{a_1})$ or a group of signals of a plurality of bits $(a_1, b_1 \ldots)(\overline{a_1}, \overline{b_1} \ldots)$ as long as the signals constituting the signal systems are complementary to each other.

The logic section $C_{1A}$ has switching circuits $S_1$ and $S_2$ series-connected between a power source $V_{DD}$ and the ground, and an output signal $Y_1$ is drawn out from an intermediate connection point between the circuits $S_1$ and $S_2$. The switching circuit $S_1$ has the signal $A_1$ fed thereto, while the switching circuit $S_2$ has the signal $\overline{A_1}$ fed thereto so that either one of the two switching circuits $S_1$ and $S_2$ is turned ON and the other is turned OFF.

In the illustrated example, the switching circuit $S_1$ is OFF, while the switching circuit $S_2$ is ON, and the output signal $Y_1$ has a ground level.

Each of the switching circuits $S_1$ and $S_2$ is constituted by a single FET in the case where each of the signal systems $A_1$ and $\overline{A_1}$ is a single bit signal. On the other hand, in the case where each of the signal systems $A_1$ and $\overline{A_1}$ composed of a plurality of bits, a plurality of FET's are included in each of the switching circuits $S_1$ and $S_2$ so as to reform predetermined logic functions.

Each of switching circuits $S_3$ through $S_8$ is also constituted by any desired number of FETs in the input signal system fed thereto.

The logic section $C_{1B}$ includes the switching circuit $S_3$ having the signal system $\overline{A}$ fed thereto and the switching circuit $S_4$ having the signal system $A_1$ fed thereto. These switching circuits $S_3$ and $S_4$ are connected in series between the power source $V_{DD}$ and the ground, and from an intermediate connection point between the circuits $S_3$ and $S_4$ an output signal $\overline{Y_1}$ is obtained which is complementary to the output $Y_1$ of the logic section $C_{1A}$. Each of pairs of the switching circuits $(S_1, S_2)$ and $(S_3, S_4)$ is adapted to operate in a push-pull manner in response to the signal systems $A_1$ and $\overline{A_1}$.

Second-stage logic sections $C_{2A}$ and $C_{2B}$ are constituted by the switching circuits $S_5$ through $S_8$ so as to receive the signals $Y_1$ and $\overline{Y_1}$ as inputs and deliver output signals $Y_2$ and $\overline{Y_2}$ complementary to each other, respectively. The switching circuits $S_5$ and $S_6$ are adapted to operate in a push-pull manner in response to the signals $Y_1$ and $\overline{Y_1}$ fed thereto respectively, while the switching circuits $S_7$ and $S_8$ are adapted to operate in a push-pull manner in response to the signals $\overline{Y_1}$ and $Y_1$ fed thereto respectively. It is to be noted that besides the complementary signals $Y_1$ and $\overline{Y_1}$ delivered from the first-stage logic sections, complementary signals B and $\overline{B}$ delivered from other sections may be fed to the logic sections $C_{2A}$ and $C_{2B}$, as shown in FIG. 3, to constitute the circuits $S_5$ through $S_8$. In the logic circuit according to the invention, all the logic sections are adapted to operate in a push-pull manner in response to the respective complementary signal systems. Therefore, no DC path is produced at all, and the logic circuit operates with a low power consumption. Moreover, since the capacitance loaded onto the output of each logic section is rapidly charged and discharged through the corresponding switching circuit turned ON, it is possible to realize a high-speed operation.

Next, a preferred embodiment of the invention will be described hereinunder through a logic section as one stage with reference to FIG. 4.

The gate electrodes of a pair of FETs $(P_1, Q_1)$ are connected to a pair of terminals $(\overline{A}, A)$, respectively. The drain and source electrodes of the D-mode FET $P_1$ are connected to a power source terminal $V_{DD}$ and an output terminal $\overline{Y}$, respectively. The drain and source electrodes of the E-mode FET $Q_1$ are connected to the output terminal $\overline{Y}$ and the ground, respectively, to form a circuit $C_{1A}$. On the other hand, the gate electrodes of a pair of FETs $(P_2, Q_2)$ are connected to the pair of terminals $(\overline{A}, A)$, respectively. The drain and source electrodes of the D-mode FET $Q_2$ are connected to the power source terminal $V_{DD}$ and the output terminal Y, respectively, while the drain and source electrodes of the E-mode FET $P_2$ are connected to the output terminal Y and the ground, respectively, to form a circuit $C_{1B}$, thereby constituting a pair of circuits ($C_{1A}$, $C_{1B}$). To the output terminals $\overline{Y}$, Y of the respective circuits $C_{1A}$ and $C_{1B}$, signals complementary to each other are delivered as described later. It is to be noted that a parasitic capacitance $C_1$ ($C_2$) is present between the output terminal $\overline{Y}$ (Y) and the ground.

The propagation delay $t_{pd}'$ of the inverter circuit pair as one stage in accordance with this embodiment will be calculated as follows.

Figure 4:
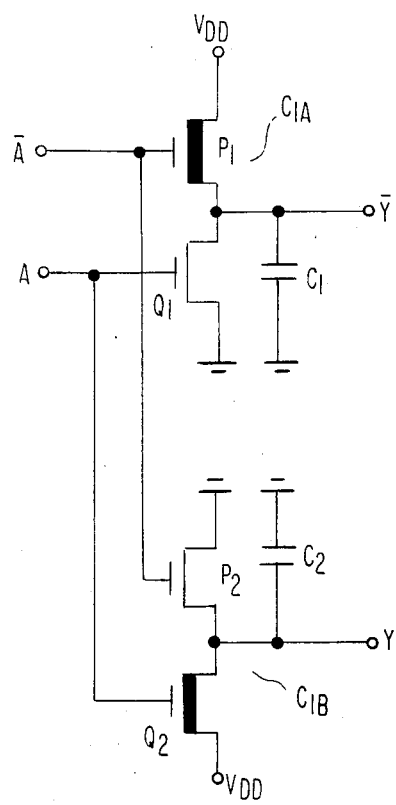
FIG. 4 is a circuit diagram of a typical inverter circuit pair used in at least one stage of a preferred embodiment of the invention.

FIG. 5 shows currents $I_{p1}$ and $I_{Q2}$ flowing through the respective D-mode FETs $P_1$ and $Q_2$ and potentials $\overline{V}_Y$ and $V_Y$ at the respective terminals $\overline{Y}$ and Y, with the horizontal axis taken as a time axis, in case of applying to the input terminal A($\overline{A}$) shown in FIG. 4 such a step signal $V_A$ ($\overline{V}_A$) that, with a potential amplitude $V_{DD}$, the state of low potential $0_{[V]}$ and the state of high potential $V_{DD}$ continue for the time $T_L'(T_L'')$ seconds and $T_H'(T_H'')$ seconds (wherein $T_L'=T_{H''}$, $T_H'=T_{L''}$), respectively, and the low potential state and the high potential state repeat at a period $T'=T_L'+T_H'$. Immediately before the time $t_0'$, the FETs $P_1$, $Q_1$ and $Q_2$ are in the conducting state, while the FET $P_2$ is in the nonconducting state, and on the assumption that $\beta_D/\beta_E \approx 0$, the output potential $\overline{V}_Y$ is $0_{[V]}$, while the output potential $V_Y$ is as high as $V_{DD}$. Immediately after the time $t_0'$, the gate potentials of the FETs $Q_1$ and $Q_2$ are $0_{[V]}$, while the gate potentials of the FETs $P_1$ and $P_2$ are as high as $V_{DD}$. Consequently, on the assumptions that $V_{TE}>0_{[V]}$, $V_{TD}<0_{[V]}$, the E-mode FET $Q_1$ is made nonconductive, while the D-mode FET $P_1$ is made conductive better than that immediately before the time $t_0'$, so that the capacitance $C_1$ is charged. Accordingly, the output potential $\overline{V}_Y$ rises with time, and after the time has sufficiently passed, the potential $V_{DD}$ is delivered to the output terminal of the circuit $C_{1A}$. On the other hand, in the circuit $C_{1B}$, the E-mode FET $P_2$ is in the conducting state, while the D-mode FET $Q_2$ is in a conducting state closer to the nonconducting state than that immediately before the time $t_0'$, so that the electric charge stored in the capacitance $C_2$ until the time $t_0'$ is started to be discharged through the E-mode FET $P_2$. Consequently, the output potential $V_Y$ at the output terminal Y lowers with time, and after the time has sufficiently passed, the output potential $V_Y$ becomes $0_{[V]}$ and thereafter, it is maintained constant at a voltage of $0_{[V]}$. In this case, the time required for the output potential $\overline{V}_Y(V_Y)$ to become $V_{DD}/2$ after the time $t_0'$ is expressed by $t_{pdr}'$ ($t_{pdf}'$). Next, immediately after the time $t_1'$, the gate potentials of the respective FETs $Q_1$ and $Q_2$ are $V_{DD}$, while the gate potentials of the respective FETs $P_1$ and $P_2$ are low $0_{[V]}$. Consequently, the FET $Q_1$ is in the conducting state, while the FET $P_1$ is in a conducting stage closer to the nonconducting state than that immediately before the time $t_1''$ so that the electric charge stored in the capacitance $C_1$ until the time $t_1'$ is started to be discharged through the FET $Q_1$. Accordingly, the output potential $\overline{V}_Y$ lowers from the value $V_{DD}$ toward the value $0_{[V]}$. After a predetermined time, the circuit $C_{1A}$ delivers a low potential $0_{[V]}$ to the output terminal $\overline{Y}$. On the other hand, in the circuit $C_{1B}$, the FET $P_2$ is in the nonconducting state, while the FET $Q_2$ is in a conducting state better than that immediately before the time $t_1'$, so that the capacitance $C_2$ is started to be charged, and the output potential $V_Y$ rises from the value $0_V$ toward the value $V_{DD}$. Consequently, after a predetermined time, the circuit $C_{1A}$ delivers an output potential $V_{DD}$. In this case, the time required for the output potential $\overline{V}_Y(V_Y)$ to become $V_{DD}/2$ after the time $t_1'$ is expressed by $t_{pdf}'(t_{pdr}'')$.

As will be understood from the foregoing description, the inverter circuit pair ($C_{1A}$, $C_{1B}$) deliver potentials (signals) different from each other to the output terminals of the circuits $C_{1A}$ and $C_{1B}$ in response to the input signals fed to the input terminal pair, respectively.

It will be apparent that $t_{pdr}'=t_{pdr}''$ and $t_{pdf}'=t_{pdf}''$ owing to the symmetry between the circuits $C_{1A}$ and $C_{1B}$ and that between the input signals $V_A$ and $\overline{V}_A$. Since each of the D-mode FETs $P_1$ and $Q_2$ operates as not an AC power source but an FET, it is found that
$t_{pdr}'=CV_{DD}/\beta_D(V_{DD}+|V_{TD}|)^2$,
$t_{pdf}'=CV_{DD}/\beta_E(V_{DD}-V_{TE})^2$. Therefore, the delay-power product $t_{pd}'$ of the embodiment is calculated from the following formula:

$$t_{pd}' = \frac{CV_{DD}}{2}\left(\frac{1}{\beta_D(V_{DD}+|V_{TD}|)^2} + \frac{1}{\beta_E(V_{DD}-V_{TE})^2}\right)$$

Next, an average power consumption W' of the inverter circuit pair ($C_{1A}$, $C_{1B}$) in accordance with the embodiment will be calculated during one period T' from the time $t_0'$ to the time $t_2'$.

Due to the fact that the power consumption W' is equal to the sum of the average powers consumed by the respective circuits $C_{1A}$ and $C_{1B}$ during one period T' and that $T_H''=T_L'$, the average power consumption W' is calculated from the following formula:

$$W' = \frac{1}{T'}\left(CV_{DD}2 + \frac{V_{DD}\beta_D V_{TD}2}{2}T_{H'}\right) +$$

$$\left(CV_{DD}2 + \frac{V_{DD}\beta_D V_{TD}2}{2}T_H''\right)$$

$$= 2\left(\frac{CV_{DD}2}{T'} + \frac{V_{DD}\beta_D V_{TD}2}{4}\right)$$

The average power consumption per stage formed by one inverter circuit pair agrees with the above-mentioned W', owing to the symmetry between the circuit pair, independently of the number of inverter stages even in the case where an inverter circuit pair arrangement with n stages is imagined which is obtained by cascading n number of circuit pairs ($C_{1A}$, $C_{1B}$), ($C_{2A}$, $C_{2B}$), ..., ($C_{nA}$, $C_{nB}$), i.e., connecting to the input terminal pair ($\overline{A}$, A) of each of the circuit pairs ($C_{iA}$, $C_{iB}$)(i=2 to n−1) the output terminal pair ($\overline{Y}$, Y) of the circuit pair ($C_{(i-1)A}$, $C_{(i-1)B}$) and then connecting the output terminal pair ($\overline{Y}$, Y) of the circuit pair ($C_{iA}$, $C_{iB}$) to the input terminal pair ($\overline{A}$, A) of the circuit pair ($C_{(i+1)A}$, $C_{(i+1)B}$), and the potentials having waveforms $\overline{V}_A$, $V_A$ shown in FIG. 5 are applied to the input terminal pair ($\overline{A}$, A) of the inverter pair ($C_{1A}$, $C_{1B}$) as the first stage.

Accordingly, the delay-power product $E'=t_{pd}'W'$ of the inverter circuit pair ($C_{1A}$, $C_{1B}$) in accordance with the embodiment is calculated from the following formula:

$$E' = CV_{DD}\left(\frac{CV_{DD2}}{T'} + \frac{V_{DD}\beta_D V_{TD2}}{4}\right)\left(\frac{1}{\beta_D(V_{DD} + |V_{TD}|)^2} + \frac{1}{\beta_E(V_{DD} - V_{TE})^2}\right)$$

When the delay-power product ratio E'/E and the propagation delay ratio $t_{pd}'/t_{pd}$ are calculated for each of the inverter circuit pair as one stage in accorance with the embodiment of the invention and the conventional inverter circuit as one stage, it is found that $E'/E = 2t_{pd}'/t_{pd}$. Therefore, it is only necessary to pay attention to $t_{pd}'/t_{pd}$. However, for the period, it is assumed that T=T' in order to prepare conditions for comparison.

On the assumption that $\beta_D/\beta_E = 0$, the propagation delay ratio is as follows: $t_{pd}'/t_{pd} = (V_{TD}/V_{DD} + |V_{TD}|))^2$. Then it is clear that if the supply potential (the input signal high potential) $V_{DD}$ can satisfy the condition of $V_{DD} \geq 0.42 |V_{TD}|$, the inverter circuit pair of the invention excels the conventional inverter circuit for both the propagation delay and the delay-power product.

In the conventional inverter circuit such as shown in FIG. 1, it is possible to consider that $V_{DD} = 2|V_{TD}|$. Therefore, it is found that $t_{pd}'/t_{pd} = 0.11$, $E'/E = 0.22$. Accordingly, it will be understood that the inverter circuit pair in accordance with the embodiment can be improved in the propagation delay and delay-power product by 9 times and 4.5 times the conventional inverter circuit, respectively.

Moreover, the inverter circuit pair in accordance with the embodiment has a significant advantage as follows. Namely, as will be apparent from the formulae for calculating the proparation delay $t_{pd}'$ and $t_{pd}''$ although the propagation delay of the conventional inverter circuit increases in inverse proportion to the square of the threshold voltage $|V_{TD}|$ of the D-mode FET, the propagation delay of the inverter circuit pair in accordance with the embodiment hardly depends on the threshold voltage $|V_{TD}|$ and will never exceed the critical value:

$$t_{pd}' = \frac{CV_{DD}}{2}\left(\frac{1}{\beta_D V_{DD2}} + \frac{1}{\beta_E(V_{DD} - V_{TE})^2}\right)$$

If the required propagation delay exceeds the critical value, it is possible to reduce the average power consumption of the inverter circuit pair to $W' \approx 2CV_{DD}^2/T'$ by decreasing the threshold voltage $V_{TD}$ of each of the D-mode FETs $P_1$ and $Q_2$. The reduction in the average power consumption is found to be remarkable since $CV_{DD}^2/T' \gg V_{DD}\beta_D V_{TD}^2/4$ under the general MOS integrated circuit manufacturing conditions.

In addition, as will be obvious from FIG. 4 and the fact that the input signals are a pair of signals complementary to each other, there is no possibility that the gate potentials of each of the sets of FETs, $P_1$ and $Q_1$; $P_2$ and $Q_2$ concerning the respective circuits $C_{1A}$ and $C_{1B}$ become $V_{DD}$ and low $0_V$ at the same time. Accordingly, properly selecting the threshold voltage ($V_{TD}$) eliminates the condition required to make the gain coefficients $\beta_D$ and $\beta_E$ be $\beta_D/\beta_E \approx 0$, so that it is possible to design what is called a ratio-less circuit.

The above advantages mentioned concerning the inverter circuit pair of the invention are not exclusive thereto and exist in any desired circuit pair such as (AND, NAND), (OR, NOR), ..., etc.

Next, the effects of the logic circuit, i.e., CP³MOS inverter, according to the invention will be described hereinunder in comparison with the conventional MOS inverter with reference to FIGS. 6 and 7.

Figure 6A:
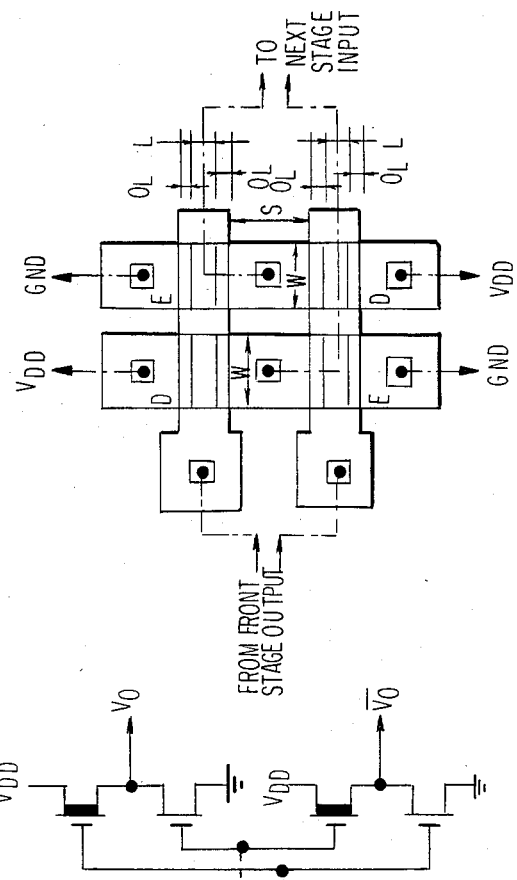
FIGS. 6(a-d) is a diagram showing two circuit arrangements for comparing the present invention with the prior art.

In this explanation, a comparison is made between the CP³MOS circuit according to the invention and the conventional E/D MOS concerning propagation delay, delay-power product, operating voltage and noise immunity, for the case of serial connections of several CP³MOS and conventional E/D MOS inverters, shown in FIG. 6(a) and (b), respectively.

Figure 6C:
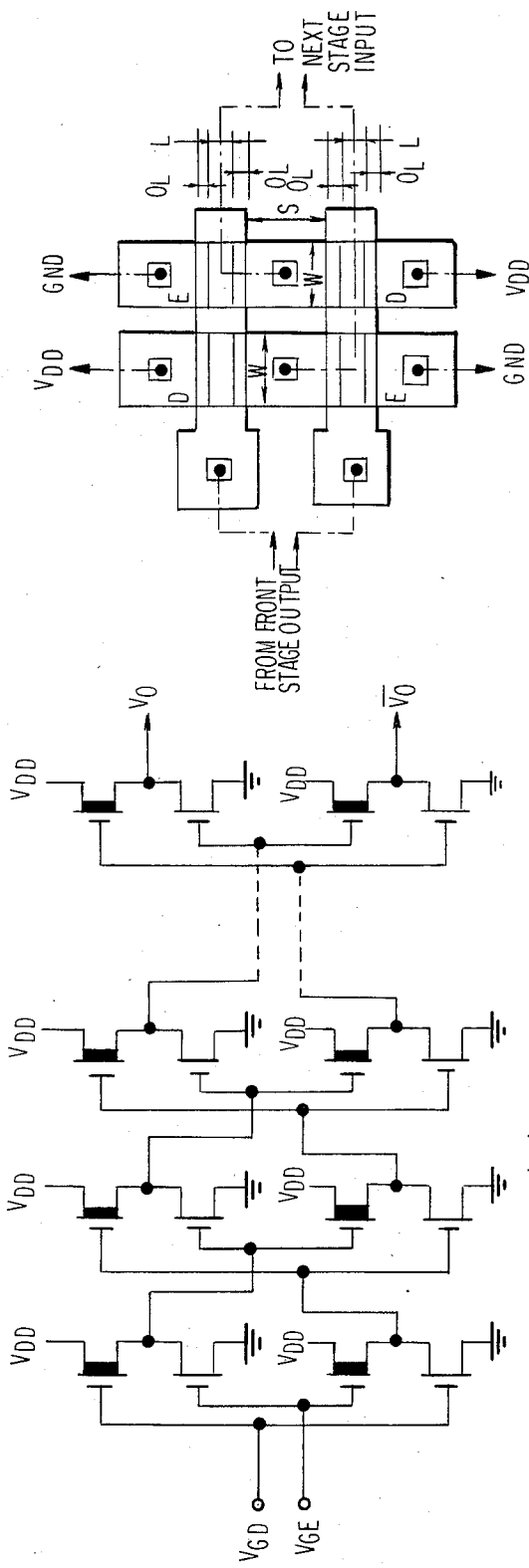
Figure 6B:
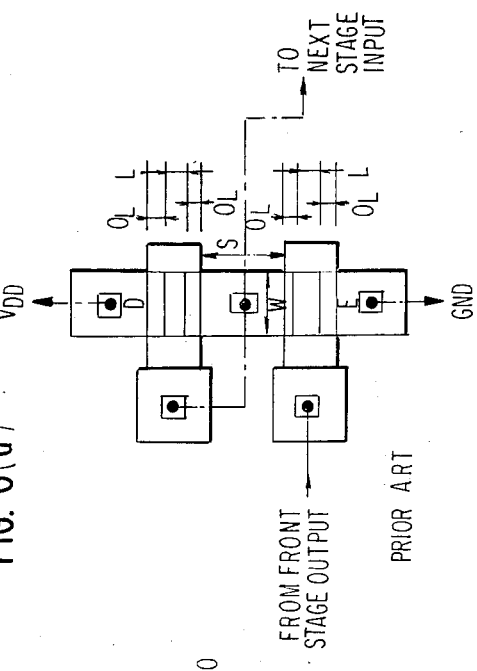
Figure 6D:
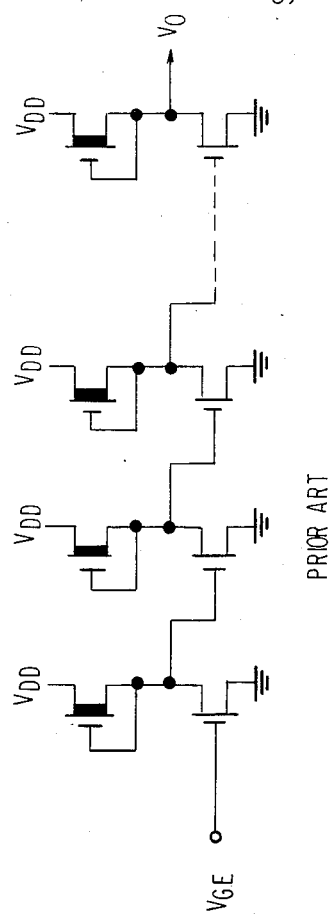

FIGS. 6(c) and (d) show examples of pattern layouts for the CP³MOS and the conventional E/D MOS inverter, respectively.

The symbols used in the following explanation are listed in Table 1.

TABLE 1

List of Symbols

Suffixes D and E should be referred to as depletion and enhancement MOST.

| Symbol | Description |
|---|---|
| A,$\bar{A}$,B,$\bar{B}$,C,$\bar{C}$ | Input logic signals. |
| L,$L_E$,$L_D$ | Effective channel length. |
| W,$W_E$,$W_D$ | Channel width. |
| $\mu$,$\mu_E$,$\mu_D$ | Effective carrier mobility in channel region. |
| $t_{Ox}$ | Thickness of gate oxide $SiO_2$. |
| $C_L$ | Output load capacitance. |
| $C_O$ | Gate capacitance per unit area. |
| $\beta$,$\beta_E$,$\beta_D$ | Gain factor $\beta = \mu C_o W/L$. |
| $V_{OH}$,$V_{OL}$,$V_{OM}$ | High, low and middle output voltage in static condition. |
| $V_{GE}$,$V_{GD}$ | Gate applied voltage. |
| $V_{TE}$,$V_{TD}$ | Threshold voltage where source voltage is 0 V. |
| | $I_{TD} = \beta_D V^2_{TD}/2$. |
| $i_E$,$i_D$ | |
| $K_O$,$K_S$, $_O$,$N_A$,$n_i$,q | Specific permitivity of $SiO_2$ and Si, dielectric vacuum constant, substrate impurity concentration, intrinsic carrier concentration and electronic charge. |
| $\phi_F$ | Substrate Fermi potential: $\phi_F = \frac{kT}{q} \ln(N_A/n_i)$. |
| $V_{TD}(X)$,$V_{TDC}$,$V_{TDD}$ | Depletion MOST's threshold voltage as function of its source voltage X; $V_{TD}(X) = V_{TD} + \frac{\sqrt{2K_S o q N_A}}{C_O}(\sqrt{2\phi_F X} - \sqrt{2\phi_F})$, $V_{TDC} = \frac{\sqrt{2K_S o q N_A}}{C_O}(\sqrt{2\phi_F} - \sqrt{2\phi_F + V_{DD}})$, and $V_{TDD} = V_{TD}(V_{DD}/2)$. |
| $O_L$ | Overlap length between gate and source or drain. |
| s | Gate span between deletion and enhancement MOST. |
| $x_J$ | Junction depth. |
| $\phi_B$ | Build-in voltage of the junction. |
| $C_J$ | Source and drain junction capacitances |

TABLE 1-continued
List of Symbols per unit area $C_J = \dfrac{oK_{sq}qN_A}{2\phi_B}$.

| | |
|---|---|
| $t_D$ | Output signal delay time from $V_{OH}$ or $V_{OL}$ to $V_{OM}$. |
| $t_{PLH}, t_{PHL}$ | Low-to-high, high-to-low propagation delay. |
| $t_{PD}, t_{PDMAX}$ | Propagation delay and maximum $t_{PD}$ as a function of $V_{TD}$. |
| $f$ | Input signal frequency. |

It is assumed that $L_D=L_E=L$, $W_D=W_E=W$ and $\mu_E=\mu_D=\mu$. Then, $\beta_E=\beta_D$. Neglecting stray line capacitances, it is found that $C_L = C_J W(S+20_L) + 2(L+20_L)WC_O$ for the CP³MOS inverter, and $C_L + C_J W(S+20_L) + (L+20_O)WC_O$ for the conventional E/D MOS where $S=4(L+20_L)$, $O_L=0.6X_J$. All data are calculated under the conditions $T=25°$ C., $N_A=1\times10^{15}$ cm$^{-3}$, $W=7$ μm, $x_J=0.5$ μm, $\phi_B=0.8$ V, $f=0$ Hz, $t_{OX}=450$ Å, $V_{DD}=5$ V, $V_{TE}=0.7$ V and $\mu=200$ cm²/V sec.

(a) Propagation delay comparison

Figure 7A:
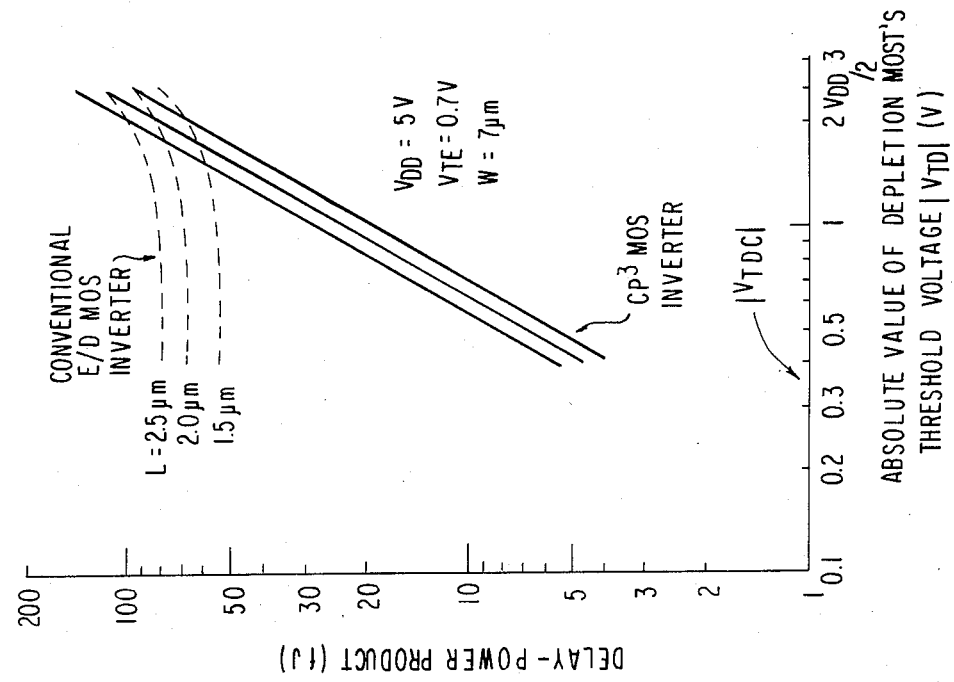
FIGS. 7(a and b) is a diagram showing electrical characteristics of the circuits shown in FIG. 6.

FIG. 7(a) shows the calculated $t_{PD}$ as a function of $|V_{TD}|$ with parameter L.

First, the propagation delay $t_{PD}$ improvement in the CP³MOS inverter is ascribed to the smaller $t_{PLH}$. Secondly, as the CP³MOS inverter's load capacitance is always less than twice that of the conventional E/D MOS, so the CP³MOS inverter's tPD in the range $|V_{TDC}| \leq |V_{TD}| \leq V_{DD}/2$, is always smaller than that for the conventional E/D MOS.

(b) Delay-power product comparison

Figure 7B:
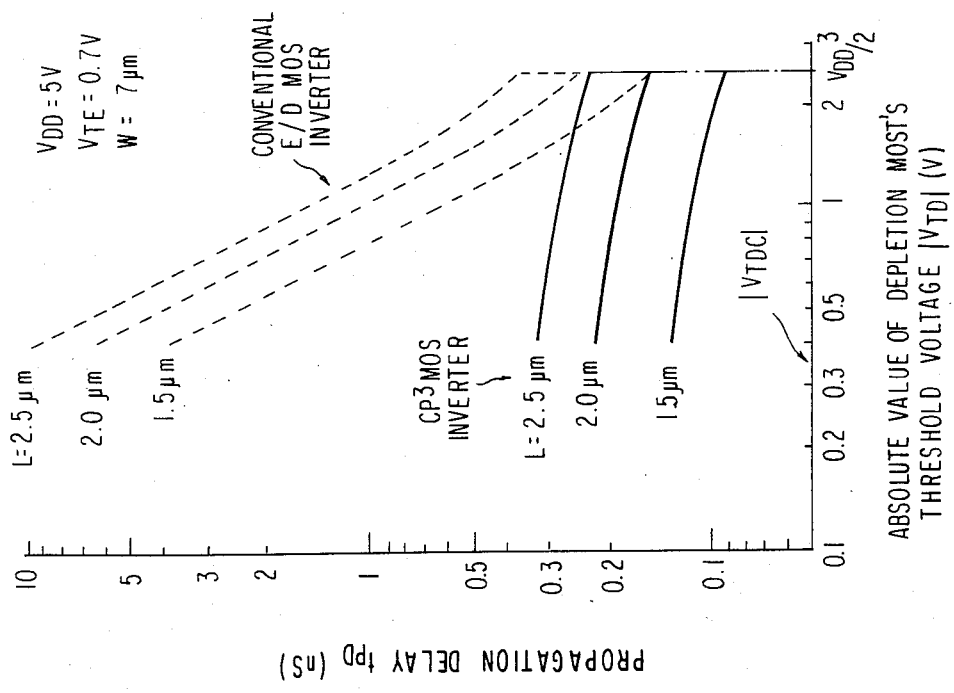

The calculated values of delay-power product are plotted in FIG. 7(b) as a function of $|V_{TD}|$ with parameter L.

Power dissipation in the CP³MOS inverter is about twice as large as that for the conventional E/D MOS, as shown in Table 1. However, delay-power product is about one-tenth as large as that for a conventional E/D MOS at low $|V_{TD}|$. This comes from the smaller CP³MOS-inverter propagation-delay.

(c) Operating voltage comparison

FIG. 7(a) indicates that the conventional E/D MOS inverter's $V_{TD}$ must be greater than that of the CP³MOS inverter to get small propagation delay. Then, it is concluded from $$V_{DD} \geq \frac{\beta_D V_{TD}^2}{2\beta_E V_{TE}} + \frac{3}{2} V_{TE}$$

that the CP³MOS circuit has a wider operating voltage range that the conventional E/D MOS circuit.

(d) Noise immunity comparison

Logic threshold voltage $V_C$ is given as $V_{TE} + \sqrt{\beta_D/\beta_E}|V_{TD}|$ in the conventional E/D MOS inverter. This means that range $V_{DD}=V_{GE}<V_C$ corresponds to the logic signal "1", and $v_C<V_{GE}\leq 0$ V corresponds to the logic signal "0". Thus, noise margin is $V_{DD}-V_C$ for logic signal "1" and is $V_C-V_{OL}$ for "0". The noise margin for the conventional E/D MOS circuit design is $(V_{DD}-V_{OL})/2$ at best.

On the other hand, the CP³MOS inverter noise margin is quite different from that for the conventional E/D MOS Logic signal corresponds to the polarity of the difference $\Delta V=V_{GD}-V_{GE}$, independently from $B_{TE}$, $V_{TD}$, $\beta_D$, $\beta_E$, $V_{DD}$. Then, noise margin becomes $|V_{GD}-V_{GE}|$. Usually, it is equal to $V_{DD}-V_{OL}$. Then, the noise immunity of CP³MOS inverter is at least twice as large as that for the conventional E/D MOS.

The noise margin for the conventional E/D MOS varies with $V_{TE}$, $V_{TD}$, $\beta_D$, $\beta_E$, $V_{DD}$ for the logic signal "1". However, for the signal "0", the noise margin is fixed with no relation to $V_{DD}$. This causes a narrow operating voltage-range and severe circuit design for the conventional E/D MOS.

However, the CP³MOS inverter's noise margin, for both logic signals "0" and "1", is not only proportional to $V_{DD}$, but is also almost independent from $V_{TE}$, $V_{TD}$, $\beta_E$, $\beta_D$. This enables a wide operating voltage range and easy circuit design for the CP³MOS circuit.

Next, another preferred embodiment of the invention will be described hereinunder in detail with reference to FIGS. 8 through 10.

This embodiment is, as shown in FIG. 8, for realizing a logic circuit having a NOR gate $G_1$ for receiving inputs A and B, a NOR gate $G^2$ for receiving the output of the gate $G_1$ and an input C, and an inverting gate $G_3$ for receiving the output of the NOR gate $G_2$ thereby to obtain an output logic $Y = \overline{A+B} + C$.

FIG. 9 shows the conventional E/D logic circuit realizing the circuit of FIG. 8. A gate $G_{1P}$ equivalent to the gate $G_1$ shown in FIG. 8 is constituted, as is generally known, by a D-mode FET $Q_{91}$ as a load and E-mode FETs $Q_{92}$ and $Q_{93}$ as input transistors. A gate $G_{2P}$ corresponding to the gate $G_2$ shown in FIG. 8 is constituted by a D-mode FET $Q_{94}$ as a load and E-mode FETs $Q_{95}$, $Q_{96}$ as input transistors. Moreover, the gate $G_3$ shown in FIG. 8 is realized as an inverter $G_{3P}$ constituted by a D-mode FET $Q_{97}$ and an E-mode FET $Q_{98}$.

As will be apparent from FIG. 9, in the logic circuit according to the conventional circuit configuration, a DC path is produced when at least one of the three logic gates $G_{1P}$, $G_{2P}$ and $G_{3P}$ generates a low level signal as its output. Moreover, in the logic circuit shown in FIG. 9, when the output Y is low level a DC path is produced in each of the gates $G_{1P}$ and $G_{3P}$, and when the output Y is high level a DC path is produced in the gate $G_{2P}$. Therefore, the power consumption is large, and each gate is adapted to operate in a ratio manner, so that the operating speed is inevitably low.

Figure 10:
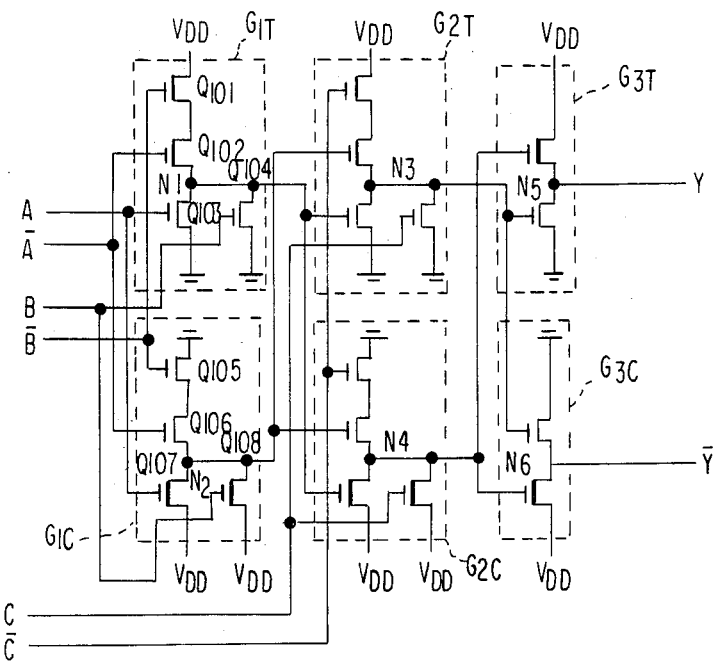
FIG. 10 is a circuit diagram of the logic circuit of FIG. 8 according to the present invention.

FIG. 10 shows a practical arrangement of the logic circuit, shown in FIG. 8, realized according to the invention.

The gate $G_1$ is constituted by a logic section $G_{1T}$ adapted to generate outputs $\overline{A} \cdot \overline{B}$ at an output node $N_1$ on receipt of inputs A, $\overline{A}$ and B, $\overline{B}$, and a logic section $G_{1C}$ adapted to generate an output $A+B$ at an output node $N_2$ on receipt of the inputs A, $\overline{A}$ and B, $\overline{B}$ similarly. The logic section $G_{1T}$ is a push-pull NOR circuit including D-mode FETs $Q_{101}$ and $Q_{102}$ which are series-connected between a power source $V_{DD}$ and the output node $N_1$ and have the signals $\overline{B}$ and $\overline{A}$ applied to their respective gates, and E-mode FETs $Q_{103}$ and $Q_{104}$ which are parallel-connected between the output node $N_1$ and the ground and have the signals A and B applied to their respective gates. The logic section $G_{1C}$ is a push-pull OR circuit adapted to generate a logic opposite to that of the section $G_{1T}$ and delivers the output $A+B$ which is NOT the outputs $\overline{B}\cdot\overline{B}$ of the section $G_{1T}$.

Consequently, the circuit of the logic section $G_{1C}$ is constituted by replacing the power source $V_{DD}$ and the ground in the circuit of the section $G_{1T}$ with each other and moreover employing D-mode FETs $Q_{107}$ and $Q_{108}$ as the transistors on the power source side.

The gate $G_2$ is constituted by a logic section $G_{2T}$ adapted to receive inputs C and $\overline{C}$ and the complementary output pair $\overline{A \cdot B}$ and the output $A+B$ fed thereto from the logic sections $G_{1T}$ and $G_{1C}$, respectively, and generate the NOR logic thereof, and a logic section $G_{2C}$ adapted to generate the OR of the above-mentioned inputs. The logic section $G_{2T}$ and the logic section $G_{2C}$ have the same circuit configurations as the logic section $G_{1T}$ and the logic section $G_{1C}$, respectively. A pair of complementary signals generated from the sections $G_{2T}$ and $G_{2C}$ are applied to the sections $G_{3T}$ and $G_{3C}$ in combination constituting the gate $G_3$ to generate the outputs Y and $\overline{Y}$, respectively.

Here, in the case where either the output Y or $\overline{Y}$ is not necessary for the utilization circuit, the section $G_{3T}$ or $G_{3C}$ may be omitted.

Figure 11:
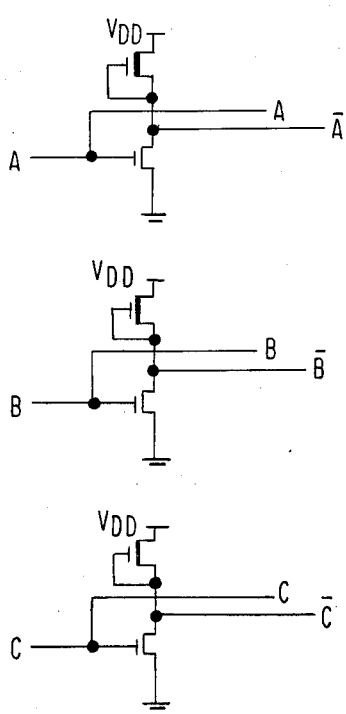
FIG. 11 is a circuit diagram showing a method of connecting the inverter according to the conventional circuit system and the circuit pair according to the invention.

It is to be noted that the invention requires to form a pair of complementary signals from the input signals in the case where the input signals applied from the outside are not in the form of a pair of complementary signals. The complementary signals can be formed by inverting the input signals through the conventional inverter. More specifically, in order to combine the conventional circuit and the CP³MOS circuit by the invention, it is only necessary to employ such inverter circuits as shown in FIG. 11 for forming a pair of signals. Conversely, in case of combining the circuit pair of the invention and the conventional circuit, either one of the pair of signals is employed.

A semiconductor integrated circuit utilizing a plurality of circuit pairs of the invention in combination offers the following advantages.

Namely, the semiconductor integrated circuit employing the circuit pairs of the invention has signals about twice as many as those generated and coupled in a semiconductor integrated circuit having the same function as the former constituted by combining the conventional circuits.

Accordingly, it becomes possible to reduce the number of logic circuit stages (for example, it is possible to omit the inverter circuit pair as the final stage constituted according to the invention in FIG. 10), so that the operation of the integrated circuit as a whole can be made faster through the reduction in number of the logic circuit stages.

On the other hand, it seems, when FIGS. 9 and 10 are compared with each other, that it needs transistors and wirings about twice as many as those in the conventional circuit to realize a logic circuit having the same function as the conventional one by combining a plurality of circuit pairs of the invention. Actually, the numbers of required transistors and wirings are almost the same as those of the conventional circuit, since although the conventional integrated circuit has necessity to combine basic gates such as inverters, AND circuits, NAND circuits, OR circuits, etc. for realizing any desired logic circuit, the invention employs complementary signals as well as true logic signals and any logic circuit can be constituted in one circuit stage.

Figure 12:
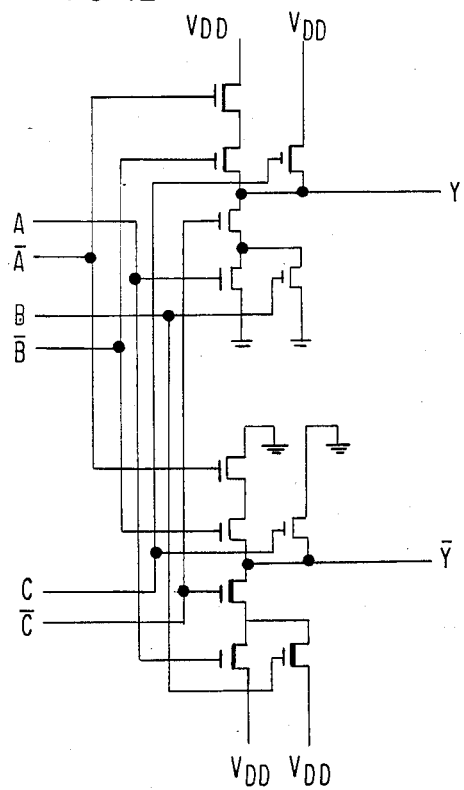
FIG. 12 is a circuit diagram of another embodiment of the invention shown in FIG. 10.

FIG. 12 shows the circuit, shown in FIG. 10, constituted by reducing the number of the logic stages according to the above-mentioned considerations and employing a $Y=\overline{A+B}+C$ gate as one stage. As will be clear from FIG. 12, to form a logic $Y=A+B+C$, the conventional integrated circuit needs 8 transistors, while the invention needs 12 transistor, therefore, the number of transistors required for the invention is not twice but 1.5 times as large as the conventional integrated circuit.

The invention, however, has the following advantages as described above. Namely, the propagation delay and delay-power product are largely improved, the operating speed is made higher through the reduction in number of logic stages occurring in case of combining a plurality of circuit pairs of the invention, and a ratio-less circuit design is feasible. Therefore, the invention is able to greatly contribute to the realization of a large-scale integrated circuit capable of operating at high speed and with small power consumption.

The above-mentioned advantages of the invention are displayed more distinctly as the logic circuit becomes more complicated. Accordingly, there is favorably more remarkable reductions in the propagation delay and the power consumption caused owing to the fact that there is no need for combination of basic gates.

I claim:

1. A multi-input logic circuit comprising:
 (a) an input logic stage performing a predetermined logic operation with respect to a first plurality of logic input signals, said input logic stage including:
 first receiving means for receiving said first plurality of logic input signals;
 second receiving means for receiving a second plurality of logic input signals that are complementary to said first plurality of signals;
 a first power source terminal to which a first voltage is applied;
 a second power source terminal to which a second voltage is applied;
 a first transistor combination circuit coupled between a first output terminal and said second power source terminal, said first transistor combination circuit having a plurality of enhancement field effect transistors, each connected to said first receiving means for receiving a different one of said first plurality of logic input signals and providing a current path between said first output terminal and said second power source terminal only when the combination of said first plurality of logic input signals is in a predetermined state;
 a second transistor combination circuit coupled between said first power source terminal and said first output terminal, said second transistor combination circuit having a plurality of depletion field effect transistors, each connected to said second receiving means for receiving a different one of said second plurality of logic signals, and providing a current path of a first resistance between said first power source terminal and said first output terminal when said first logic input signals are in said predetermined state and providing a current path of a second resistance therebetween at all other times, said second resistance being lower than said first resistance;
 (b) a second multi-input logic stage for producing an output signal that is complementary to the output signal at said first output terminal, said second logic stage including:
 a second output terminal,
 a third transistor combination circuit having a plurality of enhancement field effect transistors coupled between said second output terminal and said second power source terminal, said third transistor combination circuit being connected to said means for receiving said second plurality of logic input signals, and a fourth transistor combination circuit having a plurality of depletion field effect transistors coupled between said first power source terminal and said second output terminal, said fourth transistor combination circuit being connected to receive said first plurality of logic input signals; and (c) a third logic stage including:

means for receiving additional true and complementary logic signals;

a first logic section composed of a fifth transistor combination circuit having a plurality of enhancement field effect transistors coupled between a first output node and said second power source terminal, and a sixth transistor combination circuit having a plurality of depletion field effect transistors coupled between said first output node and said first power source terminal;

said fifth transistor combination circuit being responsive to said first output signal and said additional true signal; and said sixth transistor combination circuit being responsive to said second plurality of logic input signals and said additional complementary signal.

2. A logic circuit comprising means for receiving a plurality of first logic signals, means for receiving a plurality of second logic signals each signal being complementary to a respective one of said first logic signals, a first terminal to which a first potential is applied, a second terminal to which a second potential is applied, a first logic section including a first node, a first arrangement of a plurality of enhancement field effect transistors, said first arrangement operatively providing an electrical path between said first node and said first terminal in response to a first given state of said first logic signals, a second arrangement of a plurality of depletion field effect transistors, said second arrangement operatively providing an electrical path of a small resistance and an electrical path of a large resistance between said first node and said second terminal in response to a second given state of said second logic signals and to a third given state of said second logic signals, respectively, said third given state of said second logic signals corresponding to said first given state of said first logic signals said second given state of said second logic signals being complementary to said first given state of said first logic signals, a third arrangement of a plurality of enhancement field effect transistors, said third arrangement operatively providing an electrical path between said second node and said first terminal in response to said second given state of said second logic signals and a fourth arrangement of a plurality of depletion field effect transistors, said fourth arrangement operatively providing an electric path of a small resistance and an electrical path of a large resistance between said second node and said terminal in response to said first given state of said first logic signals and a fourth given state of said first logic signals complementary to said first given state, respectively, and a third logic section including a third node, a fifth arrangement of at least one enhancement field effect transistor having a current path coupled between said first terminal and said third node and receiving a signal from said first node at a gate thereof and a sixth arrangment of at least one depletion field effect transistor having a current path coupled between said third node and said second terminal and receiving a signal derived from said second node at a gate thereof.

3. The circuit according to claim 2, further comprising a fourth logic section including a fourth node, a seventh arrangement of at least one field effect transistor having a current path coupled between said first terminal and said fourth node and receiving a signal from said second node at a gate thereof and an eighth arrangement of at least one field effect transistor having a current path coupled between said fourth node and said second terminal and receiving a signal from said first node at a gate thereof.

4. A multi-input logic circuit for receiving a plurality of input logic signals and a plurality of complementary logic signals complementary to said input logic signals composed of only the same conductivity type of field effect transistors, said logic circuit comprising:

(a) an input logic stage having a first output terminal for producing a first output signal, said input logic stage including:

a first transistor combination circuit having a plurality of enhancement field effect transistors coupled between said first output terminal and a first voltage terminal, each of said transistors receiving one of a plurality of input signals, a second transistor combination circuit having a plurality of enhancement field effect transistors coupled in series between a second output terminal and said first voltage terminal, each of said transistors receiving one of said plurality of complementary input signals;

(b) a first connecting circuit coupled said first output terminal and a second voltage terminal, said first transistor circuit and said first connecting circuit forming a NOR circuit receiving said plurality of input signals, said first connecting circuit including a third transistor combination circuit of a plurality of depletion field effect transistors each being connected in series between said first output terminal and said second voltage terminal and each having a gate for receiving one of said plurality of complementary input signals;

(c) a second connecting circuit coupled between said second output terminal and said second voltage termainal, said second combination circuit and said second connecting circuit forming a NAND circuit receiving said plurality of complementary signals, said second connecting circuit including:

a fourth transistor combination circuit of a plurality of depletion field effect transistors each being coupled in parallel between said second output terminals and said second voltage terminal and each having a gate for receiving one of said plurality of input signals; and (d) a subsequent stage receiving said first output signal and a second output signal derived from said second output terminal and operating in a push-pull manner.

5. The multi-input logic circuit according to claim 4, wherein said subsequent logic stage includes means for receiving additional true and complementary logic signals, a first logic section composed of a fifth transistor combination circuit of a plurality of enhancement field effect transistor coupled between a first output node and said second terminal and a sixth transistor combination of a plurality of depletion field effect transistors coupled between said first output node and said first terminal, and a second logic section composed of a seventh transistor combination circuit of a plurality of enhancement field effect transistors coupled between a second output node and said second terminal and an eigth transistor combination circuit of a plurality of depletion field effect transistors coupled between said first terminal and said second output node, said sixth and seventh transistor combination circuit receiving said complementary output signal and said additional complementary signal, said fifth and eight transistor combination circuits receiving said output signal and said additional true signal.

* * * * *